July 4, 1950

R. J. AUST 2,513,392

HIGH-FREQUENCY TUNER

Filed March 17, 1949

INVENTOR.
Robert J. Aust
BY
Nicholas Lang Jr.
ATTORNEY

Patented July 4, 1950 2,513,392

UNITED STATES PATENT OFFICE 2,513,392

HIGH-FREQUENCY TUNER

Robert J. Aust, Indianapolis, Ind., assignor to P. R. Mallory & Co., Inc., Indianapolis, Ind., a corporation of Delaware Application March 17, 1949, Serial No. 81,850

23 Claims. (Cl. 250—40)

This invention relates to a tuner and particularly to one of the type suitable for high frequency electromagnetic carrier wave signals in the megacycle range.

Heretofore, attempts have been made to tune television receivers and receivers of the frequency modulation type by adjusting the capacitance and inductance of resonant circuits. This arrangement is not particularly suitable for tuning high frequency circuits operating in the megacycle range since for slight changes of frequency the inductance effect of the concerned components of the electrical circuits becomes a predominating factor.

Also, television receivers and receivers of the frequency modulation type have been tuned to any selected video or broadcast channel or station by the selective switching of either an inductance or capacitance, or both into a circuit or circuits to be resonated. Provision for vernier tuning of each channel was made by having a separate trimmer control disconnected from the conventional video channel selector. Therefore, it can be realized that a compact tuner for either television or high frequency electromagnetic carrier wave signals was unattainable heretofore. Further, satisfactory vernier tuning of the above mentioned receivers by the operators thereof really did not exist since the trimmer controls were usually placed either in the rear of the receivers or within the chassis thereof for manipulation by servicemen or skilled technicians at the factory where these receivers were built or assembled.

The ideal manner of tuning either a television receiver or an FM receiver would involve changing only the inductance of the resonated circuits. In connection with the tuning of a television receiver operating under the present distributive arrangement of carrier wave channels a substantial band spread of frequency is found between one group of channels and another. For instance channel 7 is designated as operating at a frequency of 176 megacycles while channel 6 operates at a frequency of 88 megacycles, thus producing a so-called "dead" range of 88 megacycles. Heretofore, known tuners could not skip this so-called "dead" range without the use of conventional switching.

Therefore, a primary feature of this invention is the elimination of the inadequacies of prior high frequency tuners.

An important object of this invention is to provide a tuner of the vernier type for circuits responsive to high frequency electromagnetic waves.

A further object of the present invention is to provide a compact tuner for linearly tuning high frequency circuits.

Another object of this invention is to provide a tuner adapted for tuning a high frequency circuit operating on a band of frequencies in which one group thereof is widely separated from another group by a so-called "dead" range.

An additional important object of this invention is to provide a tuner for high frequency signals in which a vernier effect is provided when the tuner is being used on either the high or lower ranges of said high frequency signals.

A further object of this invention is to provide a tuner in which the effect of an absorption device is augmented by the vernier effect produced by slight changes in any one of a series of inductances which may have the form of metallic strips.

Another object of this invention is to provide a tuner in which an inductance is given such form as to provide tuning for a circuit operating on high frequency signals, the highest limit thereof being determined by the minimum length of connective leads.

A still further object is to provide a tuner in which a discrete vernier is assigned to the means for tuning a television receiver to each channel of the low band group.

An important object of this invention is to provide a tuner having two vernier means for tuning a television to any one channel, one vernier being more coarse than the other.

Another object of this invention is to provide a high frequency tuner with accurately aligned inductive components.

Other objects of the invention will be apparent from the following description and accompanying drawings taken in connection with the appended claims.

The invention accordingly comprises the features of construction, combination of elements, arrangement of parts, and methods of manufacture referred to above or which will be brought out and exemplified in the disclosure hereinafter set forth, including the illustrations in the drawings, the scope of the invention being indicated in the appended claims.

For a fuller understanding of the nature and objects of the invention as well as for specific fulfillment thereof, reference should be had to the following detailed description taken in connection with the accompanying drawings, in which.

Figure 1:
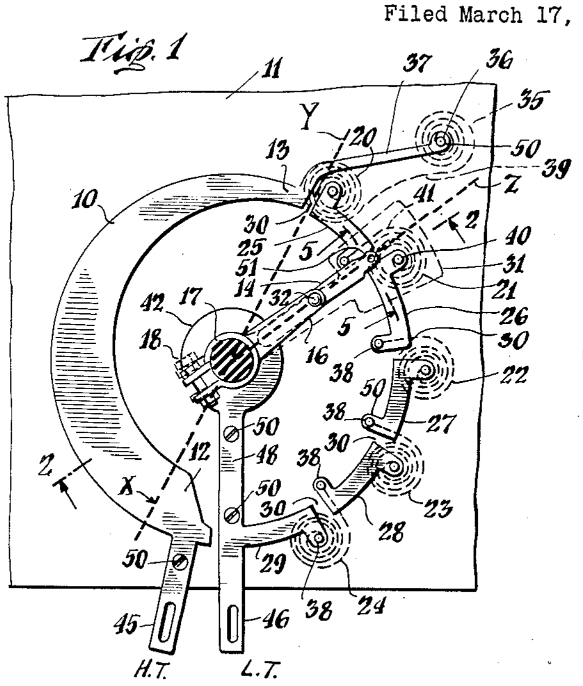
Figure 1 is a front view of a base mounted tuner constructed according to the principles of the present invention.
Figure 4:
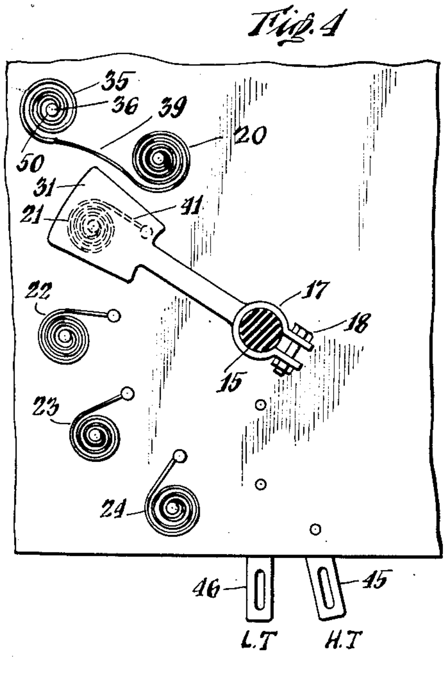
Figure 5:
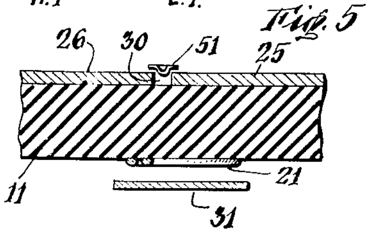

Figure 4 is a partial rear view of the tuner showing the location of the spiral coils on the base member and a shading blade covering one of the coils; and Figure 5 is an enlarged fragmentary sectional view, taken along line 5—5 of Figure 1 and showing the position of the shading blade relative to a coil when the vernier segments to which said coil are attached are bridged by the contacting portion of the contactor.

Generally speaking this invention contemplates a tuner for high frequency circuits such as are found in television receivers and receivers of the frequency modulation type. Such tuner must be able to accommodate frequencies as high as 216 megacycles and possibly higher in the future, and yet be able to handle a relatively low frequency of about 40 megacycles, or even less. In view of the present assignment of television broadcasting channels wherein a "dead" range of 88 megacycles is found, the present tuner is so constructed as to skip this range with a minimum movement of the tuner shaft. The present tuner employs a curved conductive segment of such form as to provide in conjunction with a contactor the proper inductance for tuning a circuit having predetermined circuit constants at 216 megacycles when a predetermined minimum length of said segment is in the circuit by virtue of the position of the contactor, and 176 megacycles when the position of the contactor is such as to include a maximum length of the segment in the circuit, but with the added qualification that linear tuning versus rotation of the contactor between these freqeuncies is attained as well as vernier tuning for each video channel intermediate said signals. Thus, continuous tuning of the television channels "13 to 7" inclusive is accomplished without intermediate switches.

According to another important phase of the invention means are provided for vernier tuning of the television receiver operating on any one of the low band channels "6" to "2," inclusive, while at the same time providing means for a tuning transition between the high and low band channels "7" and "6" respectively.

Referring to the drawing, the present high frequency tuner for a circuit to be resonated in response to signals from a radiant energy source transmitting at least two considerably spaced groups of high frequency video signals incorporates means including a conductor 10 preferably in the form of the previously described high frequency segment mounted on an insulative member 11 of any suitable material such as a ceramic for high electrical stability. The high band segment 10 is tapered from a high frequency portion 12 corresponding to broadcast channel "13" to a lower frequency portion 13 corresponding to channel "7". A contactor 14 is mounted on a shaft 15 through the intermediary of a frame 16 having an integral C clamp 17 with bolt and nut 18 for continuously and linearly tuning said circuit to a relatively high frequency band of signals in one channel group "13 to 7". The basic outline of the tuner also incorporates additional means including a series of coils 20–24, inclusive, and of metallic low band segments 25—29 connected together in an alternate fashion, all being coupled to the low frequency portion 13 of the tapered segment or sector 10 for tuning the mentioned circuit to a relatively low frequency band of signals in the other channel group "6 to 2".

The first segment 25 of the series of segments 25—29 and the tapered segment 10 are separated by an air gap 30 correlated with a so-called "dead" range of signals between 176 and 88 megacycles producing the spaced groups of signals. Similar air gaps 30 are inserted between pairs of segments 25—29.

The additional means includes also an eddy current blade 31 coupled to the contactor 14 by the combination of an adjustable nut and bolt 32, the frame 16 of the rotatable means. The outer end of the contactor 14 has the form of a semi-ball shaped contact 51 for bridging the air gaps between pairs of segments.

Referring to Figures 1 and 5 the contact 51 is shown as bridging the low band segments 25 and 26 over the air gap 30 separating them, and an absorption blade or plate 31 is spaced from and centralized over the coil 21.

It will be noted that the coupling between the first coil 20 of the series of spiral coils 20—24 and the continuous tuning strip 10 includes a lumped inductance in the form of another spiral winding 35 having its inner end 36 connected to a conductor 37 which is integral with the strip 10 but laterally offset therefrom. Winding 35 is not aligned with the other windings 20—24 for a reason given hereinafter. The outer turn of coil 35 is connected to the outer turn of a first coil 20 of the aligned series of coils 20—24 by a conductor 39 which is in effect a continuation of coil 35. Each one of the spaced series of low band segments 25—29, except the last segment 29, has two opposed lugs 38, 38 to which either the inner end or the outer end of the series of coils may be connected so as to produce a series of alternate coils and segments.

Figure 2:
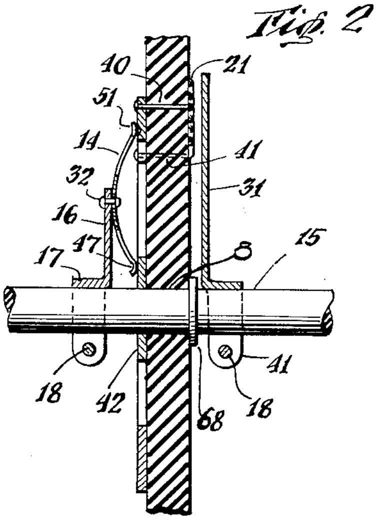
Figure 2 is a section, somewhat fragmentary in character, of the tuner, taken along the line 2—2 of Figure 1.

In the tuner now described the coils are mounted on one side of the base member 11 while the segments 10 and 25—29 are on the opposite side thereof. Referring to Figures 1 and 2 it will be seen that the coil 21 covered or shaded by blade 31 is interconnected between adjoining segments 25 and 26 by conductors 40 and 41 lead through holes bored in the member 11. Since the art of printing electrical circuits and their components is quite highly developed all the coils 20—24 and 35 with their proper connections to the segments may be done in one operation in predetermined correlation with the remaining parts of the tuner.

A bearing 8 for the shaft 15 is centralized on the base 11 with respect to these coils and segments in a manner to be presently described. A shoulder 68 on the shaft 15 prevents longitudinal movement thereof in one direction through the bearing 8. Movement of the shaft 15 in the other direction is prevented by the C clamp retained contactor 14.

In one method of constructing and mounting the segments 10 and 25—29 they are stamped from one sheet of thin flat conductive material with severable webs interconnecting the segments. The preferred method of producing these segments is by printing them on a ceramic base.

Terminal means 45 and 46 for coupling a source of high frequency energy to the portion 12 of segment 10 and the low band end of segment 29, respectively, may be stamped integral therewith from the mentioned sheet of material. Also, a fixed ring 42 on which an inner semi-ball contact 47 of the contactor 14 slidably contacts may be formed similarly integral with terminal 46 and may be connected thereto by a conductive strip 48. Ring 42 forms a continuation of the bearing 8. The resultant stamped structure including the conductor 10 and segments 25—29 may be conveniently held to the base member 11 by screws or plastic pins 50 or any other suitable means while the respective stamped parts are oriented with respect to each other by severable webs not shown. The first one of the series of air gaps 30 may be formed by severing one of the mentioned webs. It is also within the scope of this invention to stamp and adhere the segments 25—29 in the described integrated structure on the member 11 in one operation.

Figure 3:
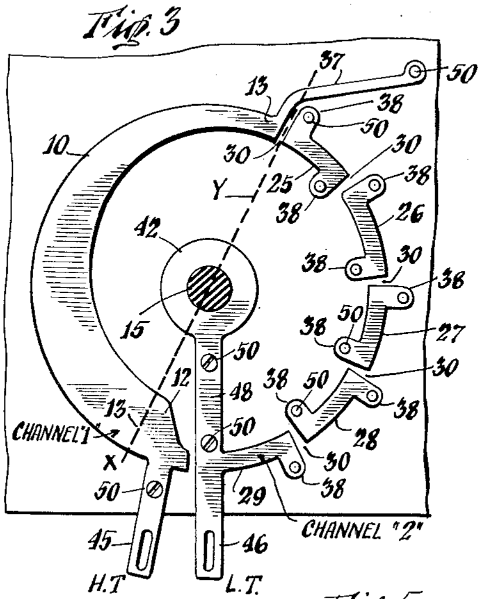
Figure 3 is a front view of the tuner without the contactor.

In the operation of the subject tuner an initial condition is considered in which the tuner is to tune a television receiver to channel "13". The station or channel selecting means including the contactor 14 is moved to a position corresponding to approximately that marked "X" in Figures 1 and 3 after the receiver has been energized. According to the present disclosure no definite stop means in the form of a detent, etc. is assigned to any one channel thereby allowing the tuner to have a degree of flexibility in tuning a television receiver to any one channel. This is made possible by the particular construction of the segment 10 assigned to the high band group of television channels, which construction has been already covered. Since linear tuning is attained by the tuner the contactor 14 need be moved only slightly either side of the assumed position of the number "13" channel marked "X" in the drawings. It will be noted by referring to Figure 1 that in the particular setting of the contactor 14 all of the vernier tuning segments 25 to 29 inclusive and the lumped inductances 35 and 20–24 inclusive are shunted by the contactor 14 through the circuit elements 42, 48 and 46 leaving a minimum path for the high frequency currents to flow through the tuner from the terminal HT to the terminal LT.

Continuing the description of the operation of the tuning it is assumed that the operator desires to tune the receiver from a previous channel setting corresponding to channel "7" to another setting corresponding to channel "6". In this case the contactor 14 with its semi-ball shaped contact 51 must be moved from the low band portion 13 of the segment 10 across the air gap 30 to the high side of the low band vernier tuning segment 25. For the purpose of making the description more easily understood channel "7" is assumed to cover, at least as far as rough tuning is concerned, the end of segment 10 contiguous with the left-hand side of the air gap 30 while channel "6" is considered to extend to the extremity of the segment 25 facing portion 13 and forming the right-hand boundary of the air gap 30. The position of the contactor 14 while it is bridging the first air gap 30 of a series thereof taken clockwise is marked Y. The position of blade 31 at this time of bridging would shade the first spiral coil 20 of the series of coils 20—24. It will be noted that a lumped inductance in the form of coil 35 offset from the blade 31 in all positions thereof is connected to the low band portion 13 of the segment 10 by the conductor 37 and also connected to the outer turn of coil 20 to the conductor 39 for the purpose of providing a lumped inductance which accommodates the band of frequencies included between channel "7" operating at 176 megacycles and channel "6" operating at 88 megacycles. Of course, the inductance of coil 20 must also be considered with lumped inductance represented in coil 35 when the tuning transition is being made. However, the design of the tuner is such that while the contact 51 bridges segments 10 and 25 a maximum effect of the eddy current blade 31 is exerted on the magnetic field of coil 20 to reduce its inductance to a minimum. Therefore, a very slight movement of the contactor 14 with the correlated blade 31 causes a considerable shift in the inductive reactance of the coil 20. One of the novel features of the present tuner is that the coils and shading blade are so constructed and oriented with the segments 25—29 that a vernier tuning range of approximately plus or minus 1.5 megacycles for each of the low channels 2 to 6 inclusive is available.

In Figure 1 the contactor 14 is shown with the contact 51 bridging the low band vernier tuning segments 25 and 26 by which the second air gap of the series thereof is bridged. This is shown more clearly in Figure 5 wherein the absorption plate or blade 31 shades the spiral coil 21 in such a way that it is centralized thereover. By centralizing the blade 31 over each coil during the time the correlated segments are bridged by the contact 51 the most effective shading of the concerned coil will take place with the beginning of the vernier effect of the segment which is increasing included with the connecting coil. As the shading effect of the blade has less and less influence on the coil, the latter will act more and more as a vernier tuning means also. Thus, when the contact 51 is moved from segment 25 to segment 26 a transition of tuning is made from channel "6" to channel "5" with very slight movement of a channel selector to produce a rough tuning of the receiver on channel 5, fine tuning being made by moving contactor 14 clockwise on the vernier tuning segment 26. However, the rough tuning is produced only within a limited movement of the blade in the region of each channel. In case the channel selector has been moved too far clockwise it may be gradually moved back to seek the proper channel location, and since the tuning range for each segment covers approximately 1.5 of a megacycle and the segment is of some length, vernier tuning in the last direction is also possible. It is believed that from the above description of the operation of the tuner the method of tuning a receiver on channel "2" representing 57 megacycles need not be covered, suffice it to comment that the contactor 14 would assume a position somewhere along the contact surface of the segment 29.

While the tuner has been described for tuning present television channels it can be readily recognized that the present concept is available for the construction of a tuner useable on higher frequencies than 216 megacycles and on lower frequencies than 44 megacycles. Also the phase of the invention which allows a rapid transition of tuning from one channel to another is not limited to a band spread of 88 megacycles between the present groups of low and high band channels. The concept of the particular tuning segment 10 is useable for a band of frequencies the upper limit of which is determined by the factor of minimum attainable inductance and capacitance. While the shading means 31 is shown in the form of a blade of non-magnetic metal, it is within the contemplation of this invention to alter the inductance of the various coils of the series of coils 20—24 by the use of powdered ferromagnetic material pressed in the form of a blade or core movable in cooperative relation with respect to the coils. Also the shading member may be of such form as to shield substantially the respective coils in whatever form they may be in order to produce the transitional effect in going from one channel to another, and to attain both rough tuning and vernier tuning, the latter starting at some intermediate shading point in the movement of the shading member. It is desired to make clear that the shading blade 31 may be constructed integral with the contactor 14.

From the above description of the subject novel tuner it is seen that a compact electrical component for a television receiver or a receiver operating on frequency modulation has been presented. Tuners of the described type can be built by mass production methods at a minimum cost per unit. The particular design of the tuner facilitates easy and accurate alignment of all its parts. For instance, the high band tuning segment 10 and the low band segments 25—29 may be first punched from a single piece of material with severable webs and connectable strips interconnecting the discrete segments so that all the segments as a unit can be mechanically aligned with the spiral coils when the fixed members of the tuner are assembled on a base of ceramic material or a similar insulator. It will be seen that many other parts of this television tuner may be produced by a simple machine operation, such as stamping. Also, the above mentioned components may be printed on the insulating base. The total space required by the subject tuner compares very favorably with the tuners now being used.

While the present invention, as to its objects and advantages, has been described herein as carried out in specific embodiments thereof, it is not desired to be limited thereby but it is intended to cover the invention broadly within the spirit and scope of the appended claims.

What is claimed is:

1. A tuner for high frequency signals covering a substantial band, comprising a base, a curved strip conductor having a flat planar surface with its cross section varying from one end thereof to the other connected to said base, the conductor end having the smallest cross-section being associated with the lowest frequency of said band of signals, and means including a movable contactor for conducting said signals to said curved conductor, the movement of said contactor causing a change in the resonant frequency of a circuit to which said tuner is connected.

2. A tuner for high frequency signals covering a substantial band, the combination comprising a base, a curved strip conductor having a flat planar surface with its cross section varying from one end thereof to the other connected to said base, the conductor end having the smallest cross section being associated with the lowest frequency of said band of signals, means including a contactor for conducting said signals to said curved conductor, and means for causing relative movement between said conductor and said contactor, said relative movement causing a linear change in the resonant frequency of a circuit to which said tuner is connected.

3. A tuner for a circuit having predetermined reactive components energized by high frequency radiant energy containing a wide band of signals, comprising a base, a strip conductive sector having a flat planar surface with a gradually decreasing cross section from one end designated as a high band end to the other end thereof designated as a low band end connected to said base, rotatable means including a slidable contactor in continuous contact with said sector, and means for conducting said radiant energy to said high band end and to said contactor, said sector being so formed that for a uniform angular change in the position of said contactor a linear change in the resonant frequency of said circuit is produced.

4. A tuner for high frequency signals covering a substantial band, comprising a spaced series of lumped inductances, a series of distributed inductances having a series of air gaps therebetween, means connecting said lumped and distributed inductances together in an alternate fashion, means including a movable contactor for conducting said signals to said inductances, and shading means coupled to said contactor and having a determined configuration which cooperates with said lumped inductances that for a position of said contactor bridging any one of said air gaps the absorption effect of said shading means on one of said lumped inductances connected to the distributed inductances forming said any one air gap is very high.

5. A tuner for high frequency signals covering a substantial band, comprising a spaced series of lumped inductances, a series of conducting strips having a series of air gaps therebetween, means connecting said lumped inductances and strips together in an alternate fashion, means including a movable contactor for conducting said signals to said inductances, and shading means coupled to said contactor and having a configuration which cooperates with said lumped inductances that for a position of said contactor bridging any one of said air gaps the absorption effect of said shading means on one of said lumped inductances connected to the strips forming said any one air gap is a maximum, movement of said contactor away from said lumped inductance and in contact with said strips causing a gradually increasing inductive effect of said lumped inductance sensitively to be augmented by that portion of said strip increasingly included with said lumped inductance.

6. A tuner for high frequency signals covering a substantial band, comprising a spaced series of lumped inductances, a series of distributed inductances having a series of air gaps therebetween, means connecting said lumped and distributed inductances together in an alternate fashion, means including a movable contactor for conducting said signals to said inductances, and shading means coupled to said contactor and having a configuration which cooperates with said lumped inductance that for a position of said contactor bridging any one of said air gaps the absorption effect of said shading means on one of said lumped inductances connected to the distributed inductances forming said any one air gap is a maximum, and means for adjusting said shading means relative to said lumped inductances and said contactor whereby accurate signal tracking is facilitated.

7. A tuner for a circuit to be resonated in response to signals from a radiant energy source transmitting at least two spaced groups of video frequency signals, comprising means including at least one tapered segment and a contactor constructed and arranged for continuously and linearly tuning said circuit to a relatively high frequency band of signals in one said channel group, and additional means including a series of alternate coils and air gap separated metallic segments coupled to a low frequency portion of said tapered segment for tuning said circuit to a relatively low frequency band of signals in the other channel group, a first segment of said series of segments and said tapered segment being separated by an air gap correlated with a "dead" range of signals producing said spaced groups of signals, said additional means including an eddy current blade coupled to said contactor and having a configuration such that each one of said coils is selectively shaded to produce maximum eddy currents in said blade at least during the interval of changing the operating characteristics of said circuit required from one channel group to another and from one channel to an adjacent one dependent upon a position of said contactor bridging said first air gap and others respectively.

8. A high frequency tuner comprising a continuous-tuning sector for high bands, a plurality of spaced sectors symmetrically arranged with said high band sector to form an arc-like distribution thereof, a plurality of coils, each one of a majority of said coils being interposed between adjacent sectors to form a lumped inductance between all said sectors, a remaining one of said coils being unaligned with the others and interposed between one end of said continuous tuning sector and an adjacent one of said spaced sectors, movable means including a metallic portion for slidably contacting said sectors and a blade for shading individually at least some of said coils in sequence to alter the inductance thereof by an eddy current effect, and means for coupling said metallic portion to a free end of said spaced sectors remote from said unaligned coil.

9. A high frequency tuner comprising a continuous tuning sector for high bands, a plurality of spaced sectors adjacent to said sector for low bands and symmetrically arranged therewith to form a connectable chain distribution thereof, a plurality of coils, each one of said coils being interposed between pairs of said sectors, a comparatively larger coil being unaligned with said coils and interposed between one end of said continuous tuning sector and an adjacent one of said sectors, rotatable means including a metallic portion for slidably contacting said sectors and for shading at least some of said coils to alter the inductance thereof sequentially by an eddy current effect, and means for coupling said metallic portion to a free end of said spaced sectors remote from said unaligned coil.

10. A high frequency tuner comprising a continuous-tuning strip for high bands, a plurality of spaced segments for low bands symmetrically arranged with said high band strip to from an arc-like distribution thereof, a plurality of spiral coils one of said coils being electrically interposed between a different pair of said spaced segments, one of said coils being unaligned with the others and interposed between one end of said continuous tuning strip and an adjacent one of said spaced segments, said one coil acting as a lumped inductance for wide band spreading, rotatable means for slidably contacting said segments and said strip for shading selectively at least some of said coils to alter the inductive reactance thereof by an eddy current effect, and means for coupling said rotatable means to a free end of one of said spaced segments most remote from said unaligned coil, said continuous tuning strip being of such form as to obtain a characteristic of linear frequency versus rotation of said rotatable means for a circuit having predetermined values of inductance and capacitance suitable for operating under high frequency signals in the megacycle range.

11. A high frequency band spread tuner comprising a elongated tuning sector for high bands, a plurality of low band sectors symmetrically arranged in an end to end spaced series with said high band sector to form an arc-like distribution thereof, a plurality of spiral coils, a majority of said coils being interconnected singly to pairs of said sectors and to said continuous tuning sector, one of said coils being electrically in parallel with one of said coils connected to said elongated sector and being radially unaligned with the others and interposed between a relatively low band end of said elongated tuning sector and an adjacent one of said low band sectors, rotatable means for slidably contacting said sectors and for shading at least some of said coils to alter the inductance thereof singly and in sequence by an eddy current effect, and means for coupling said rotatable means to a free end of said spaced sectors remote from said unaligned coil.

12. A high frequency tuner comprising conductive means for high bands, a plurality of spaced members symmetrically arranged with said high band means to form a single arc-like distribution, a plurality of spiral coils, each one of said coils forming a link between adjacent ones of said members, two of said coils linking said high band means to an adjacent one of said members, one of said two coils being unaligned with the other, rotatable means including a contact for slidably contacting said means and said members, shading means coupled to said contact and adapted sequentially to alter the inductance of at least some of said coils exclusive said unaligned one by an eddy current effect, and means for coupling said contact to the free ends of said spaced members remote from said unaligned coil, said conductive means being of such form as to provide vernier tuning and to have a response characteristic of linear frequency versus rotation of said rotatable means for a circuit having predetermined values of inductance and capacitance suitable for operation under high frequency signals in the megacycle range.

13. A television tuner by which continuous and vernier tuning of a receiver of video signals in the upper channels is attainable, comprising a tapered conductor, a series of relatively short conductors aligned with said tapered conductor, means interconnecting said conductors and the first one of said series to a relatively high current density end of said tapered conductor, movable means having a portion thereof adapted for slidably and electrically contacting each one of all said conductors at least singly dependent upon the position of said movable means, shading means coupled to said movable means for causing at least a majority of said interconnecting means to have a minimum inductance as said shading means is spacially centralized over any one thereof whereby the transition of tuning said receiver from one channel to an adjacent one is accomplished with a minimum movement of the contacting portion of said movable means, each of said series of conductors acting as vernier tuning means for each relatively low band channel, and means for electrically coupling the free end of said tapered conductor and the end one of said series of conductors to a source of radiant energy, said means including a connection to said slidably contacting portion of said movable means.

14. A high frequency tuner comprising a conducting path for switchless and vernier tuning of high bands, a plurality of spaced low band conductive paths aligned with said high band path to form an interrupted distribution thereof, a plurality of coils of the pancake type, each one of said coils being inserted electrically between the respective adjacent ones of said paths to form a connective series of alternate distributed and lumped inductances, one of said coils being unaligned with the others and interposed between one end of said continuous tuning sector and an adjacent one of said spaced sectors, movable means including both a contact for slidably contacting said paths and a metallic plate electrically coupled to said contact for shading at least some of said coils singly to alter the inductance thereof by an eddy current effect, said alteration of the inductance being a maximum as a predetermined pair of said low band paths is bridged by said contact, and means coupling said contact to the free ends of said spaced paths remote from said unaligned coil, said high band tuning path being of such form as to obtain a characteristic of linear frequency versus rotation of said rotatable means for a circuit having predetermined values of inductances and capacitance suitable for operation under high frequency signals in the megacycle range.

15. A tuner comprising a flat insulative member, a spaced series of curved vernier strips mounted on said member in mutual alignment, each spacing of said strips corresponding to the separation between adjacent broadcast channels, bearing means centralized on said member with respect to said strips, rotatable means including a contactor mounted on said bearing means for selectively engaging said strips, a flat spiral electrically interposed between pairs of said strips and offset therefrom, an adjustable shading blade coupled to said contactor, said blade having a configuration such that for a position of said contactor bridging any one of said spacings the spiral adjacent thereto has its inductance affected a maximum amount, each one of said windings being assigned to a predetermined channel, the channel having the lowest frequency requiring all of said spirals in series with said contactor.

16. A tuner comprising a conductor having one end thereof adapted to be connected to a source of radiant energy, said conductor having a surface of gradually changing form from said end to an opposite end, a spiral winding having one end thereof coupled to an opposite end of said conductor, an aligned series of metallic segments, a first one of said segments having an end coupled to an opposite end of said spiral, other symmetrically arranged spiral windings being interposed singly between said segments and between said first segment and said conductor to form a series of alternate segments and lumped inductances, movable means having a contact for slidable engagement with said conductor and said segments, shading means coupled to said contact, said shading means having a configuration cooperatively arranged with respect to said contact and said windings that a maximum effect of said shading means upon the inductance of any one of said symmetrically arranged windings is produced simultaneously with the transfer of said contact from one of said segments to an adjacent one and including to said conductor, and means coupling said contact and a free end portion of a last one of said segments to said source of energy.

17. A tuner comprising a substantially half-ring conductor, rotatable means including a contactor in slidable engagement therewith, terminal means for conducting high frequency signals of considerable band width to said contactor and to said conductor, said conductor having such form that for linear movement of said contactor away from a terminal portion of said conductor a linear change in a decreasing direction of the frequency of a circuit having predetermined circuit constants is produced, a plurality of spaced segments for conducting relatively low frequency signals and arranged with said conductor in a curvilinear array, a coil electrically interposed between pairs of said segments, said coil arrangement forming a series of coils and segments, coil means interposed between an end of said half-ring conductor remote from said terminal connected portion thereof and one end of one of said segments opposite said conductor end, a portion of said coil means being out of alignment with said coils and acting as a portion of a band spread lumped inductance, said rotatable contactor being adapted to bridge said segments and a space between a first one thereof and said conductor, and absorption means coupled to said contactor and having a positional configuration such that during the time of said bridging action the coil shunted by the bridging portion of said contactor is affected by said absorption means a maximum amount whereby band spreading is attainable with slight movement of said contactor, each of said segments acting as vernier tuning means for the coil being simultaneously shaded during the contacting of an associated segment.

18. A tuner comprising a conducting path of tapered form for a wide band of high frequency electromagnetic wave signals, a series of conducting segments of uniform cross section for a wide band of relatively low frequency electromagnetic wave signals, said segments and conducting path being arranged to form a substantially closed area, the directly opposed ends of said conducting path and the first one of said series of segments adjacent a low band portion of said tapered path being separated a predetermined distance correlated with the so-called "dead" range in broadcast channels, coil means interconnecting said opposed ends, a portion of said coil means being considerably offset therefrom, a series of similar coils alternatingly interconnected by said segments to form a continuous electrical path, terminal means for connecting the free end of said tapered path and the free end of the last one of said series of segments to a source of radiant energy, means including a rotatable contactor for providing a shunt path around at least a portion of said interconnected segments dependent upon the position of said contactor, and a shading coil blade coupled to said contactor and having a positional configuration such that a tuning transition through said "dead" range is obtained when said contactor is substantially transferred from said tapered path to the adjacent segment, said shading coil blade arrangement also providing a maximum inductance change for any one of said coils during the time said contactor is transferred from one segment to another to which any one said coil is connected.

19. A tuner for high frequency signals covering a substantial band comprising a distributed inductance in strip form, a lumped inductance coupled thereto, a shaft, a contactor means mounted on said shaft and turned thereby so as to make contact with said inductances so as to direct high frequency signals to said tuner, and inductance shading means also connected to said shaft movable thereby with respect to said lumped inductance so as to determine the amount of total inductance used by said tuner.

20. A tuner for video receivers adapted to receive signals over a wide band of frequencies comprising in combination, distributed inductance means having a strip-like configuration, contactor means for directing said signals to said inductance, driving means for moving said contactor along said inductance, lumped inductance means connected to said first inductance, and means coupled to said lumped inductance for varying the effective amount of said lumped inductance utilized by said tuner.

21. A tuner for video receivers adapted to receive signals over a wide band of frequencies comprising a strip inductance, contactor means for directing said signals to said inductance, a driving means therefor so as to move said contactor along said inductance, the position of said contactor therealong determining the amount of distributed inductance used by said tuner, lumped inductance means coupled to said first inductance, and shading means for varying the effective amount of said lumped inductance added to said distributed inductance to determine the acceptance of signals thereby.

22. A high frequency tuner adapted to operate over a wide band of signals comprising, a strip inductance, contactor means for directing signals to said inductance, means for driving said contactor along said inductance, a plurality of lumped inductances connected in series with said first inductance and with each other, and inductance shading means variably placeable with respect to said lumped inductances to determine the amount of inductance used in said tuner.

23. A tuner for high frequency signals operative over a wide band of frequencies comprising a distributed inductance, a contactor for said tuner, means for driving said contactor along said distributed inductance, the shape of said inductance being such that the change of inductance determined by the position of said contactor therealong is different for each unit of displacement of said driving means, lumped inductance means connected to said first distributed inductance in series therewith, and inductive shading means positionally related thereto operating in conjunction with said driving means to vary the effective amount of said lumped inductance present in said tuner.

ROBERT J. AUST.

REFERENCES CITED

The following references are of record in the file of this patent:

UNITED STATES PATENTS

| Number | Name | Date |
|---|---|---|
| 1,975,220 | Ananiew | Oct. 2, 1934 |
| 2,084,586 | Linsell | June 22, 1937 |
| 2,414,280 | Thomas | Jan. 14, 1947 |
| 2,482,393 | Wilburn | Sept. 20, 1949 |